US007418287B2

(12) United States Patent  
Tsao et al.

(10) Patent No.: US 7,418,287 B2
(45) Date of Patent: Aug. 26, 2008

(54) MAGNETIC RESONANCE IMAGING METHOD WITH ACCELERATED DATA ACQUISITION

(75) Inventors: Jeffrey Tsao, Basel (CH); Klaas Paul Pruessmann, Zurich (CH); Peter Boesiger, Ennetbaden (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 693 days.

(21) Appl. No.: 10/514,337

(22) PCT Filed: May 8, 2003

(86) PCT No.: PCT/IB03/01975

§ 371 (c)(1), (2), (4) Date: Nov. 12, 2004

(87) PCT Pub. No.: WO03/096049

PCT Pub. Date: Nov. 20, 2003

(65) Prior Publication Data

US 2005/0174113 A1 Aug. 11, 2005

(30) Foreign Application Priority Data

May 13, 2002 (EP) .................................. 02076844

(51) Int. Cl.
*A61B 5/055* (2006.01)

(52) U.S. Cl. .................. 600/410; 600/407; 600/408; 600/411; 600/413; 324/306; 324/307; 324/309; 324/310; 324/311; 324/312; 324/313; 324/314; 324/318

(58) Field of Classification Search ............... 600/410, 600/413, 407, 408, 411; 324/300, 306, 307, 324/309–314, 318
See application file for complete search history.

(56) References Cited

U.S. PATENT DOCUMENTS

| 5,653,233 | A | * | 8/1997 | Pelc et al. | 600/410 |
| 5,910,728 | A | * | 6/1999 | Sodickson | 324/309 |
| 6,144,873 | A | | 11/2000 | Madore et al. | |
| 6,225,804 | B1 | * | 5/2001 | Lai | 324/309 |
| 6,289,232 | B1 | * | 9/2001 | Jakob et al. | 600/410 |

(Continued)

FOREIGN PATENT DOCUMENTS

WO WO 98/21600 5/1998

(Continued)

OTHER PUBLICATIONS

"Simultaneous Acquisition of Spatial Harmonics (SMASH): Fast Imaging with Radiofrequency Coil Arrays," D.K. Sodickson et al, Magnetic Resonance in Medicine, 38(4), 1997.*

(Continued)

*Primary Examiner*—Brian L. Casler
*Assistant Examiner*—Baisakhi Roy

(57) ABSTRACT

A method of dynamic magnetic resonance imaging comprising acquiring undersampled magnetic resonance signals for successive temporal time slots. In a space spanned by geometrical space and temporal frequency and on the basic of a priori information the aliased difference magnetic resonance data which are gained by subtracting for respective k-space sampling positions data of a baseline magnetic resonance image from the undersampled magnetic resonance signals are decomposed into difference data which essentially pertain to individual spatial positions at individual time slots.

9 Claims, 2 Drawing Sheets

U.S. PATENT DOCUMENTS

| | | | |
|---|---|---|---|
| 6,326,786 B1 * | 12/2001 | Pruessmann et al. | 324/312 |
| 6,434,413 B1 * | 8/2002 | Liu et al. | 600/410 |
| 6,545,472 B2 * | 4/2003 | Prussmann et al. | 324/307 |
| 7,123,007 B2 * | 10/2006 | Katscher et al. | 324/309 |
| 2001/0056231 A1 * | 12/2001 | Jesmanowicz et al. | 600/410 |
| 2002/0097050 A1 * | 7/2002 | Kellman et al. | 324/309 |
| 2002/0103429 A1 * | 8/2002 | deCharms | 600/410 |

FOREIGN PATENT DOCUMENTS

| | | |
|---|---|---|
| WO | WO 99/54746 | 10/1999 |

OTHER PUBLICATIONS

Pruessmann, Klaas, et al.; Sense: Sensitivity Encoding for Fast MRI; Magnetic Resonance in Medicine; 1999, vol. 42, pp. 952-962.

Qing-San Xiang, et al.; K-Space Description for MR Imaging of Dynamic Objects; Magnetic Resonance in Medicine; 1993; vol. 29, pp. 422-428.

Tsao, J., et al.; Unifying Linear Prior-Information-driven Methods for Accelerated Image Acquisition; Magnetic Resonance in Medicing; 2001; vol. 46, pp. 652-660.

Tsao, J., et al.; Prior-information-enhanced Dynamic Imaging Using Single or Multiple Coils . . . ; Proc.Intl Soc. for Mag Res.; 2002.

* cited by examiner

MAGNETIC RESONANCE IMAGING METHOD WITH ACCELERATED DATA ACQUISITION

BACKGROUND

The invention relates to a magnetic resonance imaging method comprising
receiving the magnetic resonance signals with a degree of undersampling and
reconstructing a magnetic resonance image from the magnetic resonance signals.

Such a magnetic resonance imaging method is usually indicated as a parallel imaging method and is known from the paper by K. Pruessmann et al. in Magn. Reson. Med. 42(1999)952-962.

The known method is in particular known as the SENSE-technique. The undersampling of the magnetic resonance signals is associated with undersampling in the k-space and reduces the time required for scanning the k-space. In the known method the magnetic resonance signals are acquired by way of a receiver antennae system having a spatial sensitivity profile. The magnetic resonance image is reconstructed from the undersampled magnetic resonance signals on the basis of the spatial sensitivity profile. Notably, the spatial sensitivity profile is employed to undo aliasing in geometric space due to the undersampling in k-space. However, parallel imaging methods generate magnetic resonance signals that intrinsically have a relative low signal-to-noise ratio (SNR). In particular, the SNR decreases with increasing degree of undersampling.

SUMMARY

An object of the invention is to provide a magnetic resonance imaging method in which the rate of acquisition of magnetic resonance signals is significantly accelerated.

This object is achieved by a magnetic resonance imaging method according to the invention wherein
undersampled magnetic resonance signals are acquired for successive temporal time slots
for respective sampling positions in k-space temporally averaged data are derived from the undersampled magnetic resonance signals
a time-averaged magnetic resonance image is reconstructed from the temporally averaged data
undersampled difference magnetic resonance data are formed by subtracting for respective k-space sampling positions the temporally averaged data from the undersampled magnetic resonance signals
the undersampled difference magnetic resonance data are linearly transformed into undersampled conjugate difference data for respective positions in the space spanned by geometrical space and temporal frequency,
on the basis of a priori information the undersampled difference magnetic resonance data are decomposed into conjugate difference data which essentially pertain to individual spatial positions and temporal frequencies, and
successive magnetic resonance image are formed from the conjugate difference data and the time-averaged magnetic resonance data.

The sampling density of magnetic resonance signals in k-space for full sampling is determined by the chosen size of the 'field-of-view' and the desired spatial resolution. According to the invention the actual sampling density is reduced relative to the full sampling density. Accordingly the amount of magnetic resonance signals to be acquired is less and the time required for the acquisition is reduced. The amount of magnetic resonance signals to be acquired is notably reduced because the a priori information involves spatial and temporal correlations of the object that is imaged. Consequently, the magnetic resonance imaging method according to the invention is to a high degree able to decompose the undersampled magnetic resonance signals which have aliased contributions from several spatial positions in geometrical space and temporal frequencies into data which essentially pertain to individual spatial positions at individual time slots. Hence, aliasing artefacts in the reconstructed magnetic resonance image are avoided, even when a high degree of undersampling is employed. It is to be noted that the positions in geometrical space, such as in the object to be imaged, have a one-to-one correspondence with the positions of pixels in the magnetic resonance image. The term conjugate is used here to indicate that undersampled conjugate difference magnetic resonance data concern data in the (k-t) space spanned by wave vector in k-space and time, whereas the conjugate difference data concern data in (x-f) space spanned by position vector and temporal frequency. The magnetic resonance image may concern a two-dimensional image, but also may concern a more general object data set which assigns data values, notably pixelvalues or brightness values, to positions in a multi-dimensional space. The multi-dimensional space is for example a three-dimensional volume or a space spanned by spatial dimensions and time.

The baseline magnetic resonance image is reconstructed for example from the temporally averaged data, which may involve a temporal running average or from separately acquired data during time periods with little or no object motion, or is set to zero. The baseline magnetic resonance image is used as a reference with respect to which differences are computed so as to have good control over the ranges of datavalues. The baseline magnetic resonance image may be a static reference, but may also take relatively slow global variations of the range of data values into account.

These and other aspects of the invention will be further elaborated with reference to the embodiments defined in the dependent Claims.

Advantageously, the a priori information is generated from a separate series of low-resolution training magnetic resonance images. These training magnetic resonance images are reconstructed from training magnetic resonance signals that pertain to the central portion of k-space. Hence, the training magnetic resonance signals are acquired by scanning the central portion of k-space in a short acquisition time.

Preferably, the undersampled magnetic resonance signals are received by a receiver antennae system having a spatial sensitivity profile. In particular the receiver antennae system comprises several RF-receiver coils. The coil sensitivities of these coils form the spatial sensitivity profile. Advantageously, the a priori information as well as the spatial sensitivity profile are employed to undo aliasing in geometrical space and in temporal frequency that is associated with the undersampling in k-space at different time points. As more information, such as the a priori information from the training magnetic resonance images which concern spatial and temporal correlations of the object to be imaged and the spatial sensitivity profiles are employed to undo aliasing, a higher degree of undersampling may be used while aliasing artefacts in the reconstructed magnetic resonance image are still substantially avoided.

In particular, the magnetic resonance imaging method of the invention takes into account that the spatial sensitivity profile may be varying with time. Such variations for example due to movement of the receiver coils caused by motion of the object to be imaged. Notably, breathing of the patient to be examined causes movement of the receiver coils which are placed on the patient's body. According to the invention, artefacts in the magnetic resonance image caused by movement of the subject are avoided by taking account of temporal variations of the spatial sensitivity profile.

The magnetic resonance imaging method of the invention is further improved in that the sampling pattern in k-space along which the undersampled magnetic resonance signals are acquired is optimised. This is achieved by circularly shifting the sampling pattern in k-space for successive time slots in which undersampled magnetic resonance signals are acquired. These sampling pattern are further optimised in that their associated point spread function has maximum distance between its non-zero points for a given degree of undersampling. Consequently, a pixel or voxel in the magnetic resonance image having a significant signal level is most often aliased with pixels or voxels with a much lower signal level. Hence, aliasing is to a large extent avoided.

The time required for acquisition of the magnetic resonance (MR) signals is reduced by employing sub-sampling of the MR-signals. Such sub-sampling involves a reduction in k-space of the number of sampled points which can be achieved in various ways. Notably, the MR signals are picked-up through signal channels pertaining to several receiver antennae, such as receiver coils, preferably surface coils. Acquisition through several signal channels enables parallel acquisition of signals so as to further reduce the signal acquisition time.

Owing to the sub-sampling, sampled data contain contributions from several positions in the object being imaged. The magnetic resonance image is reconstructed from the sub-sampled MR-signals with the use of the a priori information, as assisted by a sensitivity profile associated with the signal channels. Notably, the sensitivity profile is for example the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the field-of-view (FOV) of the magnetic resonance image. The resolution is determined by the ratio of the field-of-view and the number of samples.

The sub sampling may be achieved in that respective receiver antennae acquire MR signals such that their resolution in k-space is coarser than required for the resolution of the magnetic resonance image. The smallest wavenumber sampled, i.e. the minimum step-size in k-space, is increased while the largest wavenumber sampled is maintained. Hence, The image resolution remains the same when applying sub-sampling, while the minimum k-space step increases, i.e. the FOV decreases. The sub-sampling may be achieved by reduction of the sample density in k-space, for instance by skipping lines in the scanning of k-space so that lines in k-space are scanned which are more widely separated than required for the resolution of the magnetic resonance image. The sub-sampling may be achieved by reducing the field-of-view while maintaining the largest k-value so that the number of sampled points is accordingly reduced. Owing to the reduced field-of-view sampled data contain contributions from several positions in the object being imaged.

Notably, when receiver coil images are reconstructed from sub-sampled MR-signals from respective receiver coils, such receiver coil images contain aliasing artefacts caused by the reduced field-of-view. From the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in U.S. Pat. No. 6,326,786.

Alternatively, the sub-sampled MR-signals may be combined into combined MR-signals which provide sampling of k-space corresponding to the full field-of-view. In particular, according to the so-called SMASH-method sub-sampled MR-signals approximate low-order spatial harmonics which are combined according to the sensitivity profiles. The SMASH-method is known as such from U.S. Pat. No. 5,910,728.

Sub-sampling may also be carried-out spatially. In that case the spatial resolution of the MR-signals is less than the resolution of the magnetic resonance image and MR-signals corresponding to a full resolution of the magnetic resonance image are formed on the basis of the sensitivity profile. Spatial sub-sampling is in particular achieved in that MR-signals in separate signal channels, e.g. from individual receiver coils, form a combination of contributions from several portions of the object. Such portions are for example simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

The invention also relates to a magnetic resonance imaging system. It is an object of the invention to provide a magnetic resonance imaging system for carrying out the magnetic resonance imaging methods according to the invention. A magnetic resonance imaging system of this kind is defined in the independent claim 9. The functions of a magnetic resonance imaging system according to the invention are preferably carried out by means of a suitably programmed computer or (micro)processor or by means of a special purpose processor provided with integrated electronic or opto-electronic circuits especially designed for the execution of one or more of the magnetic resonance imaging methods according to the invention.

The invention also relates to a computer program with instructions for executing a magnetic resonance imaging method. It is a further object of the invention to provide a computer program whereby one or more of the magnetic resonance imaging methods according to the invention can be carried out. A computer program according to the invention is defined in the independent claim 9. When such a computer program according to the invention is loaded into the computer of a magnetic resonance imaging system, the magnetic resonance imaging system will be capable of executing one or more magnetic resonance imaging methods according to the invention. For example, a magnetic resonance imaging system according to the invention is a magnetic resonance imaging system whose computer is loaded with a computer program according to the invention. Such a computer program can be stored on a carrier such as a CD-ROM. The computer program is then loaded into the computer by reading the computer program from the carrier, for example by means of a CD-ROM player, and by storing the computer program in the memory of the computer of the magnetic resonance imaging system.

BRIEF DESCRIPTION OF THE DRAWINGS

These and other aspects of the invention will be elucidated with reference to the embodiments described hereinafter and with reference to the accompanying drawing wherein FIG. 1. Effect of undersampling in k-t space on the object signal in x-f space. The figure on the left represents the true (i.e. unaliased) object signal in the x-f space. $\bar{d}_{true}$ is equivalent to the discrete matrix representation of x-f space, stretched out into a vector. If k-t space is discretely undersampled, object signal in x-f space is convolved with the point spread function, which may result in potential signal aliasing, as shown on the figure on the right. $\bar{d}_{alias}$ is equivalent to the discrete matrix representation of this x-f space, stretched out into a vector.

DETAILED DESCRIPTION

Introduction

Dynamic magnetic resonance imaging (MRI) captures an object in motion by acquiring a series of images at a high frame rate. Conceptually, the straightforward approach would be to acquire the full data for reconstructing each time frame separately. However, this approach is not feasible due to the limited speed of data acquisition. Recently, the use of partially parallel imaging methods (1) has been able to increase the acquisition rate by (typically) two- to three-fold, but acquiring high-resolution images at a high frame rate remains technically challenging.

Since a dynamic object generally exhibits spatial and temporal correlations, it should be feasible to acquire a reduced set of data and still reconstruct the spatiotemporal distribution of the object signal accurately in the least-square sense. The present invention describes a method for exploiting these correlations to improve acceleration speed significantly. In particular, this invention focuses on 3 issues:

1. How to sample k-t space to acquire the reduced set of data appropriately.
2. How to determine the spatiotemporal correlations of the data.
3. How to reconstruct the full resolution images at each time frame from the reduced data.

Methods

In this invention, a subset of k-space data (e.g. M data points out of N total) are acquired at each time frame, thus allowing an acceleration factor of R=N/M. The total number of data points in k-space, N, is determined by the chosen field of view (FOV) and the desired spatial resolution. The acceleration factor R is integer-valued. In general, a non-integer R is equivalent to choosing a slightly larger FOV such that R is the next higher integer value. The sampling pattern shifts from time frame to time frame such that after R frames, all N k-space points are updated. The process then repeats to acquire additional cycles of image frames.

From the collected data, a time-averaged image is obtained by temporally averaging all the data collected for each position in k-space. This time-averaged k-space is reconstructed by inverse Fourier transform (FT) to yield the time-averaged image, which is used at the end of the reconstruction. Additionally, the time-averaged k-space is subtracted from all the collected data, such that only the difference data are reconstructed subsequently.

Figure 1:
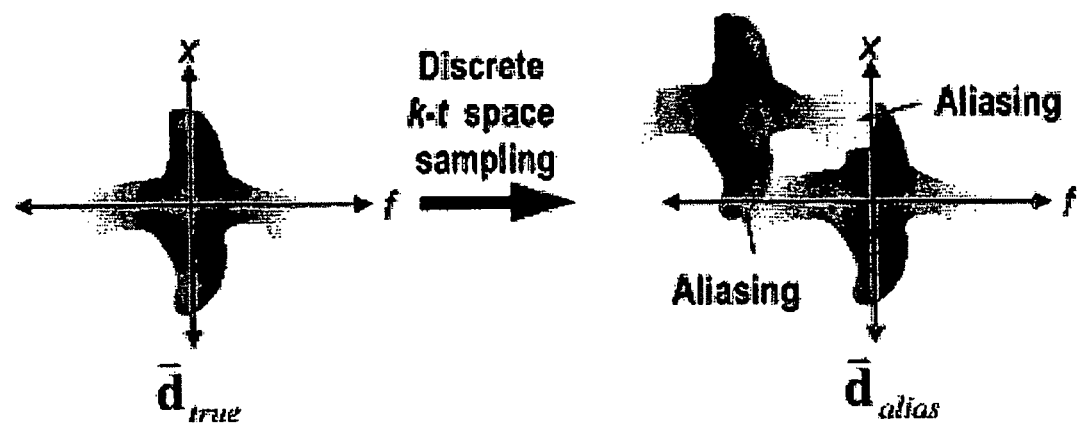

The difference data are arranged in a large "k-t" multidimensional array, with the k and t axes corresponding to the position (possibly a vector position) in k-space and time, respectively. The unacquired positions in this k-t array are filled with 0's. Applying inverse FT along all axes (i.e. k and t) converts the axes into their conjugate dimensions. This conjugate space is referred to as x-f space, where x and f refer to the spatial and temporal frequency axes, respectively. Since only a fraction of k-t space is sampled, the signal in x-f space is convolved with a point spread function, which leads to potential aliasing (FIG. 1). The point spread function is determined from the inverse FT of the sampling pattern in k-t space. Mathematically, this convolution is represented as:

$$\bar{d}_{alias} = C \bar{d}_{true} \quad (1)$$

where $\bar{d}_{alias}$ is the aliased signals in x-f space (from inverse FT of the undersampled k-t space) stretched into a vector. $\bar{d}_{true}$ is a vector, representing the true signals in x-f space without aliasing. C is a convolution matrix, the matrix coefficients of which are determined from the point spread function.

C is rank-deficient, so there are generally no unique solutions to Eq. (1). Nevertheless, a good estimate of $\bar{d}_{true}$ can be obtained if the expected relative signal magnitudes of $\bar{d}_{true}$ are known, as denoted by $\bar{w}$. Then, the estimate of $\bar{d}_{true}$ is determined as follows:

$$\bar{d}_{true} \sim W(CW)^{+} \bar{d}_{alias} \quad (2)$$

where W is a diagonal matrix, with the diagonal elements being the vector elements of $\bar{w}$. The superscript$^{+}$ denotes a Moore-Pentrose pseudoinverse. This matrix inversion is typically regularized with any of the known regularization techniques (2) to reduce potential noise amplification due to poor numerical conditioning. The symbol ~ denotes that Eq. (2) represents an estimation, not a strict equality. The purpose of using $\bar{w}$ in Eq. (2) is to reduce the effective degrees of freedom in $\bar{d}_{true}$. This is seen most easily in the extreme case if some elements in $\bar{w}$ have a value of zero, in which case the corresponding elements in $\bar{d}_{true}$ can be eliminated from Eq. (2), thus reducing the degrees of freedom. When some elements in $\bar{w}$ are small, but not identical to zero, the effect is that the subspace spanned by the vector $\bar{d}_{true}$ is shrunken along certain dimensions, thus reducing the effective degrees of freedom.

$\bar{w}$ can be obtained by acquiring a separate series of low-resolution training images at a high frame rate. Applying inverse FT in k-space and along time to these training data and taking the absolute value yield an estimate of the object signal magnitude in x-f space.

The solution from Eq. (2) represents the estimated object signal in x-f space. Applying the FT along f yields the object signal in x-t space, namely a series of dynamic images over time t. Finally, adding the time-averaged image to each time frame produces the reconstructed images.

Generalizations

1. Multi-coil

When more than one radiofrequency coil are available for signal reception, Eq. (1) has to be modified to include the influence of the coil sensitivities on the signal intensity. For the $i^{th}$ coil, one obtains the following equation:

$$\vec{d}_{alias,i} = C\, S_i\, \vec{d}_{true} \qquad (3)$$

where $\vec{d}_{alias,i}$ represent the potentially aliased x-f space signal from the $i^{th}$ coil. $S_i$ is a matrix containing the coil sensitivity information in x-f space. $S_i$ is constructed by first determining the coil sensitivity $s(x,t)$ at each time point. This general notation for $s(x,t)$ allows for the possibility of time-varying coil sensitivity, such as from subject-induced coil motion. Then, the matrix elements of $s(x,t)$ are stretched out into a vector, forming the diagonal elements of a matrix $S'_i$. $S_i$ is related to $S'_i$ as follows:

$$S_i = F^{-1} S'_i F \qquad (4)$$

where F is a unitary matrix representing discrete FT along t.

For every coil, one obtains an equation in the form of Eq. (3). If there are $N_c$ coils, putting these equations together and solving for $\vec{d}_{true}$ yields:

$$\vec{d}_{true} \sim W \left( \begin{bmatrix} CS_1 \\ CS_2 \\ \vdots \\ CS_{N_c} \end{bmatrix} \right)^+ W \begin{bmatrix} \vec{d}_{alias,1} \\ \vec{d}_{alias,2} \\ \vdots \\ \vec{d}_{alias,N_c} \end{bmatrix} \qquad (5)$$

It is important to note that compared to Eq. (2), Eq. (5) may no longer be underdetermined due to the additional matrix rows. Nevertheless, the conditioning of the linear system may still be poor.

2. Other Linear Transformations

As described above, the raw data in k-t space are converted to the reciprocal x-f space by inverse FT. In general, any linear transformation may be used (although the definition of the reciprocal x and f axes will change accordingly). In fact, a different linear transformation may be applied to each of the dimensions of k-t space. Furthermore, linear transformations that are not decomposable along the different dimensions can be applied as well. The optimal linear transformation is one, where most of the coefficients in the transformed space are zero or close to zero. It is important to note that if the linear transformation is not the inverse FT or the FT, the matrix C in Eqs. (1-3, 5) may not represent a convolution, but it will represent some general linear transformation instead.

3. Higher Order Prior Information

In Eqs. (2 and 5), the matrix W is chosen to be a diagonal matrix with the diagonal elements containing the expected relative signal magnitudes of $\vec{d}_{true}$. In general, additional prior information about $\vec{d}_{true}$ can be incorporated into this matrix as well, in which case, the W matrix is no longer restricted to be an absolute-valued diagonal matrix. Such additional prior information includes the estimated phase of a $\vec{d}_{true}$, and second or higher order statistics about the elements of $\vec{d}_{true}$.

4. Synchronous Acquisition of Training Data

As described above, the diagonal elements of W are determined from separately acquired training data. In general, the training data can also be acquired concurrently with the data being reconstructed. In other words, at each time frame, a small number of additional central k-space lines are acquired to provide the low-resolution training data.

1. Periodic Sampling in t

A preferred embodiment of this invention is to use a k-t sampling pattern that is periodic over time. If the sampling pattern repeats itself every $N_t$ time frames, then the point spread function in the discrete x-f space is significantly sparser. In particular, the point spread function will be mostly zero-valued except along parallel planes that are uniformly spaced at specific positions along the f axis. The distance among these planes is given by the length of the f axis divided by $N_t$. As a result, each set of these aliased voxel planes in x-f space can be reconstructed independently from all other voxels. This simplification of the point spread function holds even if a random k-space trajectory is used at each time frame, as long as the same trajectories are repeated every $N_t$ frames. We believe this concept of using a temporally periodic sampling pattern to simplify the inverse problem of k-t space reconstruction may be novel.

2. Cartesian Sampling in K-space and Grid Pattern in K-t Space

A preferred embodiment of this invention is to use Cartesian sampling of k-space. As a result, the frequency-encoding direction can be reconstructed conventionally by inverse Fourier transform, and the data at each frequency-encoding position can then be reconstructed separately.

In addition, it is preferred that the sampled phase-encode lines at each time frame are regularly spaced. Such a sampling pattern is easily achievable in practice, such as with a segmented EPI sequence. The periodicity of the sampling pattern along k (with k denoting the phase-encoding axis) will further contribute to the sparseness of the point spread function, in a similar manner as described above in preferred embodiment item 1. For example, if the sampling pattern acquires one out of every $N_s$ phase-encode lines at each time frame and the sampling pattern shifts to acquire a different set of phase-encode lines from frame to frame, then the sampling pattern will repeat itself every $N_s$ frames. In that case, it can be shown that the discrete point spread function will have at most $N_s^2$ non-zero points.

Figure 2:
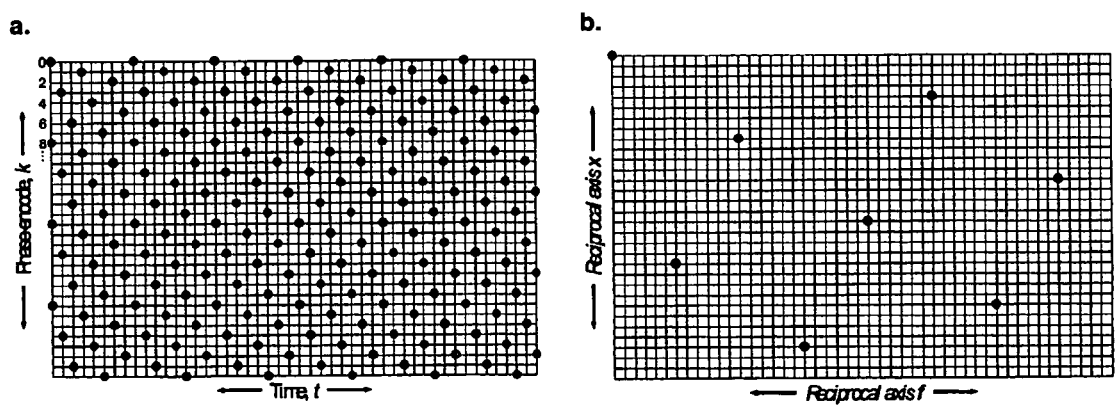
FIG. 2. (a) k-t space sampling pattern that is periodic in space and time and also forms a grid pattern. The dots represent the sampled positions in k-t space. In this example, every $8^{th}$ phase-encode line is acquired at every time frame t (b) The corresponding point spread function in discrete x-f space obtained by inverse Fourier transforming the k-t sampling pattern. Note that there are only 8 non-zero points in the point spread function

It is further preferred that the choice of the sampling pattern be restricted such that it forms a regular grid pattern in k-t space. Then, the discrete point spread function will have at most $N_s$ non-zero points only (FIG. 2). It is important to note that only a subset of k-t space sampling patterns that are periodic in both k and t form a regular grid pattern.

3. Inverse FT or FT as the Preferred Linear Transformation

As mentioned above, any linear transformation can, in principle, be applied to the raw data in k-t space to yield a conjugate x-f space. In practice, the inverse FT (or equivalently the FT) is the preferred transform for three reasons. Firstly, it can be implemented efficiently using the Fast FT (FFT) algorithm. Secondly, the result of discrete sampling in k-t space has an easily predictable effect on the object signal in x-f space, due to the Fourier convolution theorem. Thus, one may take advantage of the properties of this theorem to simplify the reconstruction significantly, as described above in preferred embodiment items 1 and 2. Thirdly, if the training data are acquired asynchronously with (e.g. before or after) the data to be reconstructed, then the inverse FT or the FT is the preferred transformation, at least for the time dimension, due to the Fourier shift theorem. This is because a shift in one dimension (e.g. time) only leads to a linear phase shift in the conjugate dimension (e.g. temporal frequency), but the magnitude is preserved. Therefore, even if the training data are not acquired at exactly the same time frames as the data to be reconstructed, the magnitude of the training data in x-f space remains valid as prior information, despite the temporal mismatch.

4. Time Invariant Coil Sensitivities

If multiple coils are used for signal reception, a preferred embodiment of this invention is to fix the position of the coils such that their sensitivities can be considered constant over time. In turn, this allows the matrix $S_i$ in Eq. (3) to be a diagonal matrix, which simplifies the solution of Eq. (3) significantly.

Figure 3:
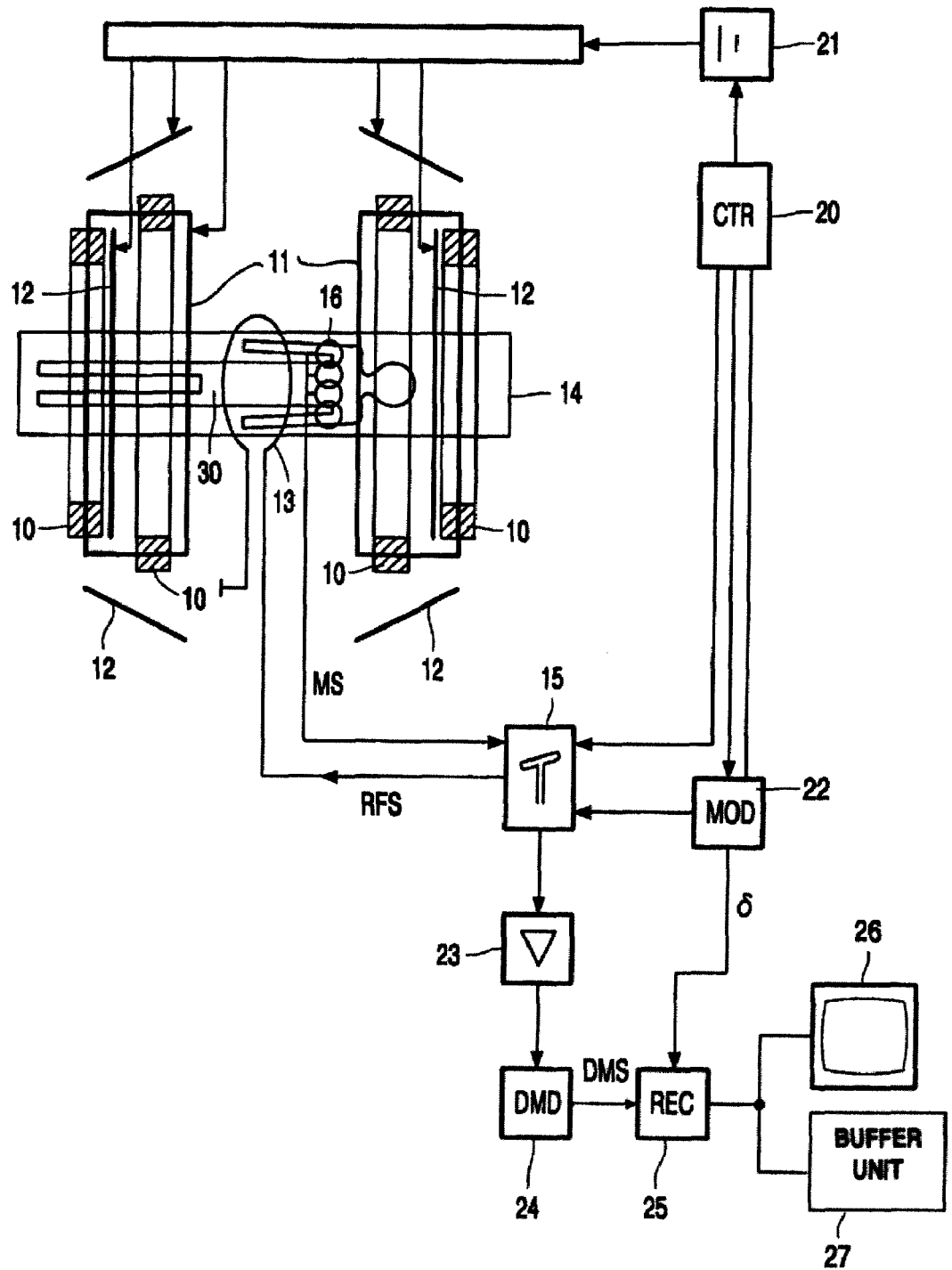
FIG. 3 illustrates a magnetic resonance system which implements the described imaging technique.

FIG. 3 shows diagrammatically a magnetic resonance imaging system in which the invention is used.

The magnetic resonance imaging system includes a set of main coils 10 whereby the steady, uniform magnetic field is generated. The main coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 15 for generating the RF excitation pulses and for picking up the magnetic resonance signals, respectively. The transmission coil 13 is preferably constructed as a body coil whereby (a part of) the object to be examined can be enclosed. The body coil is usually arranged in the magnetic resonance imaging system in such a manner that the patient 30 to be examined, being arranged in the magnetic resonance imaging system, is enclosed by the body coil 13. The body coil 13 acts as a transmission aerial for the transmission of the RF excitation pulses and RF refocusing pulses. Preferably, the body coil 13 involves a spatially uniform intensity distribution of the transmitted RF pulses. The receiving coils 15 are preferably surface coils 15 which are arranged on or near the body of the patient 30 to be examined. Such surface coils 15 have a high sensitivity for the reception of magnetic resonance signals which is also spatially inhomogeneous. This means that individual surface coils 15 are mainly sensitive for magnetic resonance signals originating from separate directions, i.e. from separate parts in space of the body of the patient to be examined. The coil sensitivity profile represents the spatial sensitivity of the set of surface coils. The transmission coils, notably surface coils, are connected to a demodulator 24 and the received magnetic resonance signals (MS) are demodulated by means of the demodulator 24. The demodulated magnetic resonance signals (DMS) are applied to a reconstruction unit. The reconstruction unit reconstructs the magnetic resonance image from the demodulated magnetic resonance signals (DMS) and on the basis of the coil sensitivity profile of the set of surface coils. The coil sensitivity profile has been measured in advance and is stored, for example electronically, in a memory unit which is included in the reconstruction unit. The reconstruction unit derives one or more image signals from the demodulated magnetic resonance signals (DMS), which image signals represent one or more, possibly successive magnetic resonance images. This means that the signal levels of the image signal of such a magnetic resonance image represent the brightness values of the relevant magnetic resonance image. The reconstruction unit 25 in practice is preferably constructed as a digital image processing unit 25 which is programmed so as to reconstruct the magnetic resonance image from the demodulated magnetic resonance signals and on the basis of the coil sensitivity profile. The digital image processing unit 25 is notably programmed so as to execute the reconstruction in conformity with the so-called SENSE technique or the so-called SMASH technique. The image signal from the reconstruction unit is applied to a monitor 26 so that the monitor can display the image information of the magnetic resonance image (images). It is also possible to store the image signal in a buffer unit 27 while awaiting further processing, for example printing in the form of a hard copy.

In order to form a magnetic resonance image or a series of successive magnetic resonance images of the patient to be examined, the body of the patient is exposed to the magnetic field prevailing in the examination space. The steady, uniform magnetic field, i.e. the main field, orients a small excess number of the spins in the body of the patient to be examined in the direction of the main field. This generates a (small) net macroscopic magnetization in the body. These spins are, for example nuclear spins such as of the hydrogen nuclei (protons), but electron spins may also be concerned. The magnetization is locally influenced by application of the gradient fields. For example, the gradient coils 12 apply a selection gradient in order to select a more or less thin slice of the body. Subsequently, the transmission coils apply the RF excitation pulse to the examination space in which the part to be imaged of the patient to be examined is situated. The RF excitation pulse excites the spins in the selected slice, i.e. the net magnetization then performs a precessional motion about the direction of the main field. During this operation those spins are excited which have a Larmor frequency within the frequency band of the RF excitation pulse in the main field. However, it is also very well possible to excite the spins in a part of the body which is much larger than such a thin slice; for example, the spins can be excited in a three-dimensional part which extends substantially in three directions in the body. After the RF excitation, the spins slowly return to their initial state and the macroscopic magnetization returns to its (thermal) state of equilibrium. The relaxing spins then emit magnetic resonance signals. Because of the application of a read-out gradient and a phase encoding gradient, the magnetic resonance signals have a plurality of frequency components which encode the spatial positions in, for example the selected slice. The k space is scanned by the magnetic resonance signals by application of the read-out gradients and the phase encoding gradients. According to the invention, the application of notably the phase encoding gradients results in the sub-sampling of the k space, relative to a predetermined spatial resolution of the magnetic resonance image. For example, a number of lines which is too small for the predetermined resolution of the magnetic resonance image, for example only half the number of lines, is scanned in the k space.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging method comprising:
   acquiring undersampled magnetic resonance signals for successive temporal time slots;
   deriving, for respective sampling positions in k-space, temporally averaged data from the undersampled magnetic resonance signals;
   reconstructing a baseline magnetic resonance image;
   subtracting for respective k-space sampling positions the temporally averaged data and the undersampled magnetic resonance signals to form undersampled difference magnetic resonance data;
   linearly transforming the undersampled difference magnetic resonance data into undersampled conjugate difference data for respective positions in the space spanned by geometrical space and temporal frequency;
   decomposing the undersampled difference magnetic resonance data into conjugate difference data which essentially pertain to individual spatial positions and temporal frequencies; and
   forming successive magnetic resonance images from the conjugate difference data and the temporally averaged data.

2. The magnetic resonance imaging method as claimed in claim 1, wherein the decomposing step concerns relative signal magnitudes of the conjugate difference data.

3. The magnetic resonance imaging method as claimed in claim 1, further including:
   acquiring one or several successive low-resolution training magnetic resonance images; and
   decomposing the undersampled difference magnetic resonance data is based on the one or several low-resolution training images.

4. The magnetic resonance imaging method as claimed in claim 3, further including:
   acquiring one or several separate sets of training magnetic resonance signals by scanning a central portion of k-space, the one or several low-resolution training images being reconstructed from these respective sets of training magnetic resonance signals.

5. The magnetic resonance imaging method as claimed in claim 1, wherein
   the undersampled magnetic resonance signals are received by a receiver antennae system having a spatial sensitivity profile; and
   the undersampled difference magnetic resonance data are decomposed on the basis of the spatial sensitivity profile into conjugate difference data which essentially pertain to individual spatial positions at individual time slots.

6. The magnetic resonance imaging method as claimed in claim 5, wherein
   the undersampled magnetic resonance signals are acquired for the successive temporal time slots by the receiver antennae system of which the spatial sensitivity profile varies with time; and
   the undersampled difference magnetic resonance data are decomposed for the successive time slots on the basis of the time-varying spatial sensitivity profile into difference data which essentially pertain to the individual spatial positions.

7. The magnetic resonance imaging method as claimed in claim 1, wherein the undersampled magnetic resonance signals are acquired according to respective pre-determined sampling patterns in k-space for the successive time slots, said respective pre-determined sampling patterns:
   being circularly shifted in k-space for the successive time slots,
   having a set degree of undersampling,
   being associated by inverse Fourier transformation with a point spread function in the space spanned by geometrical space and temporal frequency, the point spread function having non-zero values at non-zero positions in the space spanned by geometrical space and temporal frequency, and
   being selected as the sampling pattern which is associated with maximum Euclidean distance between the non-zero positions of the associated point spread function at the set degree of undersampling.

8. A magnetic resonance imaging system comprising:
   means for acquiring undersampled magnetic resonance signals for successive temporal time slots;
   means for deriving for respective sampling positions in k-space temporally averaged data from the undersampled magnetic resonance signals;
   means for reconstructing a baseline magnetic resonance image;
   means for obtaining undersampled difference magnetic resonance data by subtracting for respective k-space sampling positions the temporally averaged data from the undersampled magnetic resonance signals;
   means for linearly transforming the undersampled difference magnetic resonance data into undersampled conjugate difference data for respective positions in the space spanned by geometrical space and temporal frequency;
   means for decomposing the undersample difference magnetic resonance data into conjugate difference data which essentially pertain to individual spatial positions at individual time slots; and
   means for forming successive magnetic resonance images from the conjugate difference data and the temporally averaged data.

9. A computer readable medium comprising instructions for controlling a computer system for carrying out a method comprising the steps of:
   acquiring undersampled magnetic resonance signals for successive temporal time slots;
   deriving for respective sampling positions in k-space temporally averaged data from the undersampled magnetic resonance signals;
   reconstructing a baseline magnetic resonance image;
   obtaining undersampled difference magnetic resonance data by subtracting for respective k-space sampling positions the temporally averaged data and the undersampled magnetic resonance signals;
   linearly transforming the undersampled difference magnetic resonance data are into undersampled conjugate difference data for respective positions in the space spanned by geometrical space and temporal frequency;
   decomposing the undersampled difference magnetic resonance data into difference data which essentially pertain to individual spatial positions at individual time slots; and
   forming successive magnetic resonance images from the difference data and the baseline magnetic resonance image.

* * * * *